(12) United States Patent
Gerasopoulos et al.

(10) Patent No.: US 12,156,338 B2
(45) Date of Patent: Nov. 26, 2024

(54) CHIP PACKAGED BATTERY

(71) Applicant: The Johns Hopkins University, Baltimore, MD (US)

(72) Inventors: Konstantinos Gerasopoulos, Gambrills, MD (US); Jason E. Tiffany, Columbia, MD (US); Seppo J. Lehtonen, Columbia, MD (US); Vanessa O. Rojas, Columbia, MD (US); Spencer A. Langevin, Silver Spring, MD (US); Bing Tan, Ann Arbor, MI (US)

(73) Assignee: The Johns Hopkins University, Baltimore, MD (US)

( * ) Notice: Subject to any disclaimer, the term of this patent is extended or adjusted under 35 U.S.C. 154(b) by 195 days.

(21) Appl. No.: 18/082,924

(22) Filed: Dec. 16, 2022

(65) Prior Publication Data

US 2023/0262899 A1    Aug. 17, 2023

Related U.S. Application Data

(60) Provisional application No. 63/311,074, filed on Feb. 17, 2022.

(51) Int. Cl.
| | |
|---|---|
| *H05K 1/18* | (2006.01) |
| *H01M 10/04* | (2006.01) |
| *H01M 10/6569* | (2014.01) |
| *H01M 50/519* | (2021.01) |
| *H01M 50/105* | (2021.01) |

(52) U.S. Cl.
CPC ........ *H05K 1/181* (2013.01); *H01M 10/0431* (2013.01); *H01M 10/0468* (2013.01); *H01M 10/6569* (2015.04); *H01M 50/519* (2021.01); *H01M 50/105* (2021.01); *H01M 2300/0082* (2013.01); *H05K 2201/10037* (2013.01); *H05K 2201/10568* (2013.01); *H05K 2201/10628* (2013.01)

(58) Field of Classification Search
CPC .............. H05K 1/181; H01M 10/6569; H01M 50/519; H01M 10/0431; H01M 50/105
USPC ......................................................... 361/760
See application file for complete search history.

(56) References Cited

U.S. PATENT DOCUMENTS

| | | | | |
|---|---|---|---|---|
| 2010/0321354 A1* | 12/2010 | Kim | ........................ | H05K 1/181 345/206 |
| 2015/0022937 A1* | 1/2015 | Park | ........................ | H01G 17/00 361/270 |

\* cited by examiner

*Primary Examiner* — Andargie M Aychillhum
(74) *Attorney, Agent, or Firm* — Sung T. Kim

(57) ABSTRACT

An apparatus for mounting on a circuit board is provided. The apparatus may include a circuit board mount packaging and a battery. The circuit board mount packaging may include a cavity, a first internal lead, and a second internal lead. The first internal lead may be connect to a first external pin and the second internal lead may be connected to a second external pin. The battery may be disposed within the cavity of the circuit board mount packaging. The battery may comprise an anode and a cathode. The anode may be wire bond connected to the first internal lead and the cathode may be wire bond connected to the second internal lead.

17 Claims, 9 Drawing Sheets

CHIP PACKAGED BATTERY

CROSS-REFERENCE TO RELATED APPLICATIONS

This application claims the benefit of U.S. Provisional Patent Application No. 63/311,074, filed on Feb. 17, 2022, the entire contents of which are hereby incorporated herein by reference.

STATEMENT REGARDING FEDERALLY SPONSORED RESEARCH OR DEVELOPMENT

This invention was made with Government support under Contract No. N00024-13-D-6400 awarded by the United States Department of the Navy. The Government has certain rights in the invention.

TECHNICAL FIELD

Exemplary embodiments generally relate to power storage technologies, and more specifically relate to battery technology.

BACKGROUND

With the continued evolution of the internet of things (IoT) and electronic device mobility, there continues to be a need for improvement in the provision of power to such electronic devices and components of such devices. While battery technology continues to evolve to support the needs of IoT and mobility-based implementations, batteries continue to be a rather unique component with respect to internal connectivity and size. In many instances, batteries require wired leads to be connected to, for example, a printed circuit board. In some instances, the battery is one of few components that may still need to be hand soldered to the board and mechanically affixed via techniques requiring more than simply soldered connections. Additionally, in some instances specialized connectors (e.g., coin cell connectors) with relatively large volumes are used, which can also require specialized connection processes. As such, the connectivity of the battery can add a relatively substantial cost and time to the design and assembly of the electronic device. Accordingly, solutions that can reduce or eliminate such costs and time associated with battery-related design and assembly in the context of an electronic device would be beneficial.

BRIEF SUMMARY OF SOME EXAMPLES

According to some example embodiments, an apparatus for mounting on a circuit board is provided. The apparatus may comprise a circuit board mount packaging comprising a cavity, a first internal lead, and a second internal lead. The first internal lead may be connected to a first external pin and the second internal lead connected to a second external pin. The apparatus may further comprise a battery disposed within the cavity of the circuit board mount packaging. The battery may comprise an anode and a cathode. The anode may be wire bond connected to the first internal lead and the cathode may be wire bond connected to the second internal lead.

According to some example embodiments, another apparatus is provided for mounting on a circuit board. The apparatus may comprise a circuit board mount packaging comprising a plurality of external pins, a first internal lead, and a second internal lead. The first internal lead may be connected to a first external pin of the plurality of external pins and the second internal lead may be connected to a second external pin of the plurality of external pins. The plurality of external pins may be configured to be soldered to a circuit board. The apparatus may further comprise a battery disposed within the circuit board mount packaging. The battery may comprise an anode electrically connected to the first internal lead, a cathode connected to the second internal lead, a separator disposed between the anode and the cathode, and an electrolyte.

According to some example embodiments, a method for constructing a circuit board mount battery is provided. The method may comprise assembling a battery comprising an anode, a cathode, and an electrolyte, and disposing the battery within a circuit board mount packaging. The circuit board mount packaging may comprise a plurality of external pins, a first internal lead, and a second internal lead. The first internal lead may be connected to a first external pin of the plurality of external pins and the second internal lead may be connected to a second external pin of the plurality of external pins. The plurality of external pins may be configured to be soldered to a circuit board. The method may further comprise electrically connecting the anode to the first internal lead, and electrically connecting the cathode to the second internal lead.

BRIEF DESCRIPTION OF THE SEVERAL VIEWS OF THE DRAWING(S)

Having thus described some example embodiments in general terms, reference will now be made to the accompanying drawings, which are not necessarily drawn to scale, and wherein:

DETAILED DESCRIPTION

Figure 1:
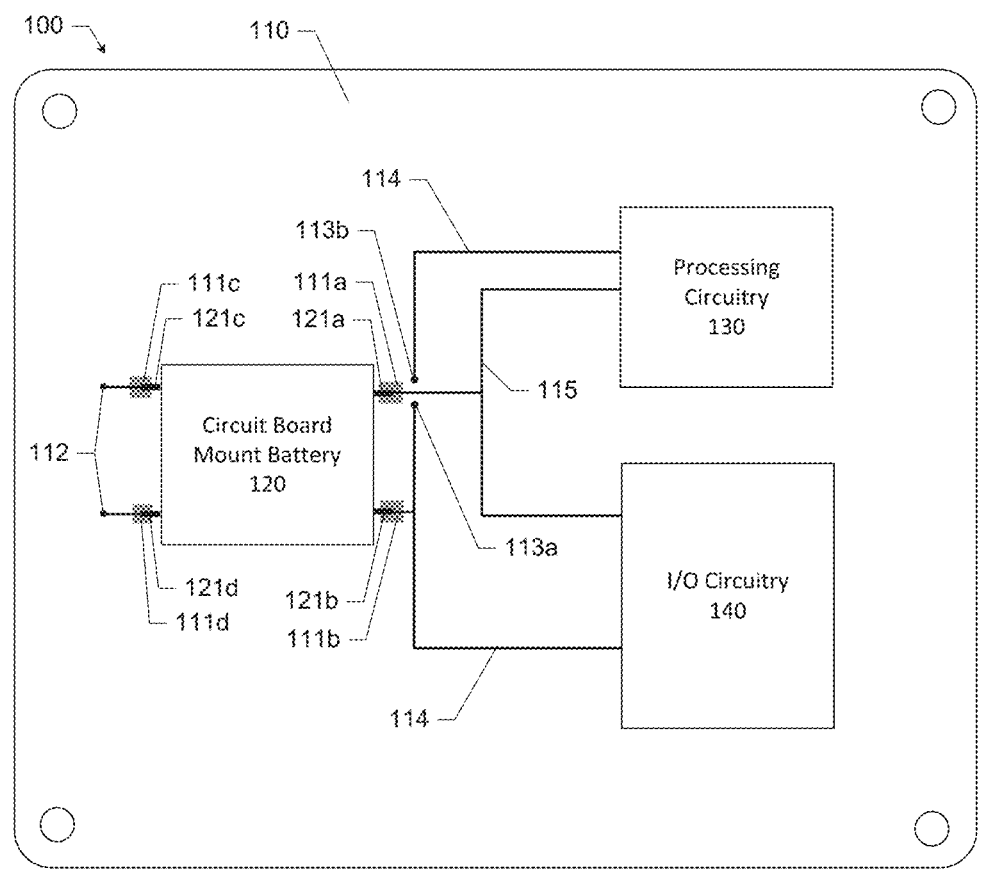
FIG. 1 illustrates an example circuit board with a circuit board mount battery according to some example embodiments.

Some example embodiments now will be described more fully hereinafter with reference to the accompanying drawings, in which some, but not all example embodiments are shown. Indeed, the examples described and pictured herein should not be construed as being limiting as to the scope, applicability or configuration of the present disclosure. Rather, these example embodiments are provided so that this disclosure will satisfy applicable legal requirements. Like reference numerals refer to like elements throughout. The term "packaging" as used herein refers to an enclosure that may house an internal component and may include internal electrical connection points or leads that are electrically connected to external pins.

In light of the foregoing, some example embodiments described herein are directed to a battery disposed in packaging to form a circuit board mount battery that facilitates operable mounting onto a circuit board. In this regard, the circuit board mount battery may be mounted on the circuit board in such a way that, according to some example embodiments, the entire weight of the circuit board mount battery may be supported by the circuit board that does not involve flexible external wiring for connection to the circuit board. As such, the circuit board mount battery may be electrically and mechanically connected to, for example, a circuit board, such as a printed circuit board (PCB) via soldering and other techniques that are commonly used with chip-type or integrated circuit-type packaged devices. According to some example embodiments, the circuit board mount battery may comprise no external wires that are used for connection to the circuit board. Rather, the battery may comprise packaging that houses one or more batteries or battery cells and has external pins that may be used for electrical and mechanical coupling to a circuit board. Further, according to some example embodiments, such a circuit board mountable battery may be constructed to have a form factor and footprint that can be readily affixed to a circuit board via standard soldering techniques, such a reflow techniques. In this regard, battery architectures and assembly techniques are described herein that facilitate application of a battery with circuit board mount packaging.

The term "packaging" as used herein refers to an enclosure that may house an internal component and may include internal electrical connection points or leads that are electrically connected to external pins. The external pins of the packaging, as described herein, may be through-hole pins (i.e., pins that extend into a hole in a circuit board to be soldered), surface-mount pins (i.e., pins that rest on a pad of a circuit board to be soldered thereto), or the like. As such, example embodiments may be embodied in a variety of different packaging as described herein. According to some example embodiments, circuit board mount battery may be disposed within packaging to facilitate the anode and cathode of the battery being connected to internal leads thereby allowing for external electrical connection to the battery via associated external pins. According to some example embodiments, the packaging in which the battery may disposed can be a chip-scale package, such as a chip carrier (e.g., leadless chip carrier). As such, due to the small size of the battery implementation, according to some example embodiments, the battery may be referred to as a microbattery.

As such, some example embodiments described herein provide form factors that are compatible with small electronic systems and circuit board integration due to reduced thickness and overall volume. Additionally, some example embodiments provide the benefit of being capable of being soldered directly to a circuit board in a manner that the solder connections provide mechanical support to the circuit board mount battery. Additionally, integrated circuit-compatible fabrication techniques can be leveraged for the assembly and implementation of some example circuit board mount batteries described herein.

According to some example embodiments, various different internal architectures of the batteries may be used in an implementation of a circuit board mount battery as described herein. For example, layered or stacked techniques may be use in the construction of the battery. Alternatively, coiled or rolled batteries may be used. Further, according to some example embodiments, the batteries may have dry electrodes that, for example, offer ultra-high areal capacities. According to some example embodiments, such areal capacities may be realized that are three-times higher than conventional batteries at three times higher voltages. As a result, various example embodiments described herein, offer an onboard electrical power solution for internet of things (IoT) devices and other mobile devices, such as wearable devices, where space constraints and limitations exist.

Referring now to FIG. 1, an implementation of an example circuit board mount battery 120 within an electronic device 100 according to some example embodiments is provided. The circuit board mount battery 120 may be physically coupled to a circuit board 110. The circuit board 110 may be printed circuit board (PCB) that includes traces and chip connection points in the form of connection pads. The connection pads may, according to some example embodiments, encircle a through hole for receiving a through hole pin for soldering.

According to some example embodiments, the electronic device 100 may comprise, for example, processing circuitry 130 and input/output (I/O) circuitry 140. The processing circuitry 130 may be powered by the circuit board mount battery 120 and may be configured to control the I/O circuitry 140, which is configured to receive and output signals.

The circuit board 110 may comprise an electrical connectivity design for connecting components that may be populated on the circuit board 110. The electrical connectivity design may comprise conductive layers, traces, pads, vias, and the like. According to some example embodiments, the circuit board 110 may be a multi-layer board that includes conductive and insulating layers where the conductive layers may be connected by vias that connect between the layers of the board 110. According to some example embodiments, one of the conductive layers may be a ground plane layer.

Accordingly, the circuit board 110 may be comprise connection pads 111a-111d, traces 114 and 115, and vias 112, 113a, and 113b, which may be formed of a conductive material such as a metal (e.g., aluminum, copper, etc.). The connection pads 111a-111d, traces 114 and 115, and vias 112, 113a, and 113b may be disposed on an insulating substrate layer. According to some example embodiments, the connection pads 111a-111d may be surface mount pads or through-hole pads that include an aperture that passes through the circuit board 110 to permit soldering of pins within the apertures on the bottom side of the circuit board 110. The traces 114 and 115 may be elongated conductive members that electrically connect between pads or the like on the circuit board 110. The vias 112, 113a, and 113b may be elements that form connections between layers of the circuit board 110. For example, the vias 113a and 113b may connected to a layer of the circuit board 110 to permit trace 114 to be routed to a different layer to avoid contacting trace 115 and thereby "jump" under the trace 115 without intersecting.

According to some example embodiments, the circuit board 110 may be populated with components such as, for example, the circuit board mount battery 120, the processing circuitry 130, and the I/O circuitry 140. The processing circuitry 130 may include, for example, a processor and a memory configured to receive signals from the I/O circuitry 140, process the signals, and output a responsive signal to the I/O circuitry 140. The I/O circuitry 140 may comprise, for example, input sensors or interface devices and output devices. According to some example embodiments, the I/O circuitry 140 may include devices that support wired or wireless communications.

For operation, the processing circuitry 130 and the I/O circuitry 140 may require an electrical power source, and the circuit board mount battery 120 may operate as the power source for powering the processing circuitry 130 and the I/O circuitry 140. In this regard, the circuit board mount battery 120 may be a battery device that is configured to be connected and mounted to the circuit board 110. According to some example embodiments, the circuit board mount battery 120 may be completely supported, from a mechanical perspective, by the circuit board 110 via soldering of the circuit board mount battery 120 to the circuit board 110. According to some example embodiments, an adhesive may be used to secure the circuit board mount battery 120 to the circuit board 110 during soldering.

As mentioned above, the circuit board mount battery 120 may comprise packaging with an internal space or cavity that houses the battery. The terminals of the battery may be connected to internal leads that connect to a respective external pins that can be soldered to the circuit board 110. In this regard, the circuit board mount battery 120 may comprise pins 121a-121d. The pins 121a-121d may be soldered to the pads 111a-111d, respectively. According to some example embodiments, the pin 121a may be connected to a first terminal (e.g., a positive terminal) of the battery housed within the packaging of the circuit board mount battery 120 and the pin 121b may be connected to a second terminal (e.g., negative terminal) of the battery housed within the packaging of the circuit board mount battery 120. As such, the first terminal of the battery may be connected to the processing circuitry 130 and the I/O circuitry 140 as electrical loads via the trace 115, and the second terminal of the battery may be connected to the processing circuitry 130 and the I/O circuitry 140 via the trace 114. Additionally, according to some example embodiments, the second terminal of the battery may be connected to pins 121c and 121d, which may connected to a ground plane of the circuit board 110 by the vias 112. According to some example embodiments, the processing circuitry 130 and the I/O circuitry 140 may also have a connection to the ground plane and the second terminal of the battery may be connected to the processing circuitry 130 and the I/O circuitry 140 via the ground plane.

Accordingly, the circuit board mount battery 120 is an example embodiment of a battery device that may be mounted directly onto the circuit board 110, without the use of flexible wires that would be used in implementations where the battery is supported off the circuit board 110. According to some example embodiments, the battery of the circuit board mount battery 120 may be rechargeable and may therefore be connectable via a charging interface to a power source to charge the battery. According to some example embodiments, the charging interface may connect to the battery via the pins 121a and 121b.

Figure 2A:
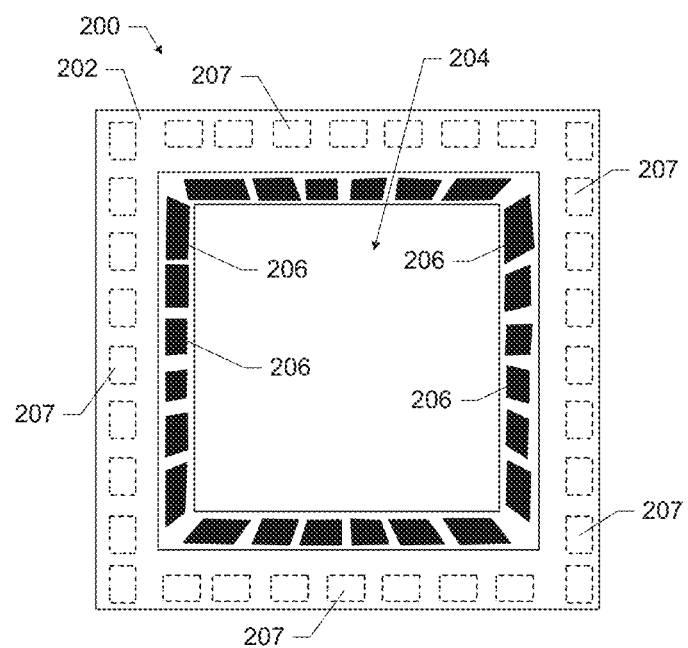
FIGS. 2A and 2B illustrate an example chip carrier and lid according to some example embodiments.
Figure 2B:
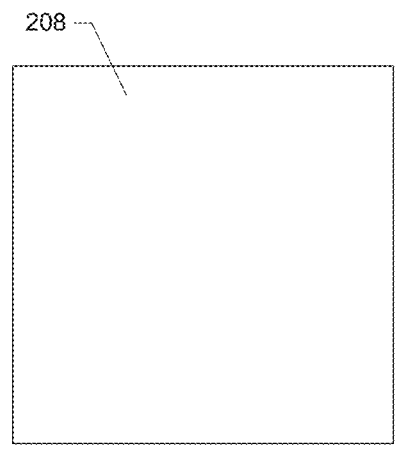

Having described an example context in which an example embodiment of a circuit board mount battery may be implemented, a description of an example packaging 200 for a circuit board mount battery is described with respect to FIGS. 2A and 2B. The packaging 200 may be embodied as an example chip carrier. The packaging 200 may comprise a carrier 202 and a lid 208. The packaging 200 is shown as a chip carrier, it is understood that a circuit board mount battery 400 may be implemented using any type of packaging, such as, for example, through-hole packaging, surface-mount packaging, chip carrier, pin grid array, flat package, small outline integrated circuit, ball grid array, multi-chip package, or the like. For example, with respect to the chip carriers, the packaging 200 may be a bump chip carrier, a leadless chip carrier (e.g., contacts or pins may be recessed vertically), a ceramic leadless chip carrier, a leaded chip carrier, a leaded ceramic chip carrier, a dual lead-less chip carrier, a plastic leaded chip carrier, a package on package, or the like.

The carrier 202 or housing may have sidewalls and a base that are formed of an insulating material such as a molded insulating resin. According to some example embodiments, the sidewalls and the base may form a cavity 204, within which a battery as a die component may be disposed. Internal leads 206 may be disposed within or adjacent to the cavity 204. Each internal lead 206 may be electrically connected to a respective external pin 207 (which may be in the form of a contact). Terminals of the battery disposed within the cavity 204 may be connected via bonding wires that are connected between the terminals and certain internal leads 206.

According to some example embodiments, the cavity 204 may be covered by a lid 208. The lid 208 may be a planar insulating element that is affixed to the top of the carrier 202 to cover the cavity 204 and protect the battery disposed within the cavity 204. The lid 208 may form an airtight seal.

It is understood that while some example embodiments of a circuit board mount battery are described herein in the context of a chip carrier, other types of chip packaging may be equally applicable to example embodiments. For example, the battery may be formed as a die that is encapsulated by the packaging such that the cavity or void takes the shape of the battery disposed within the packaging as further described below.

Figure 3:
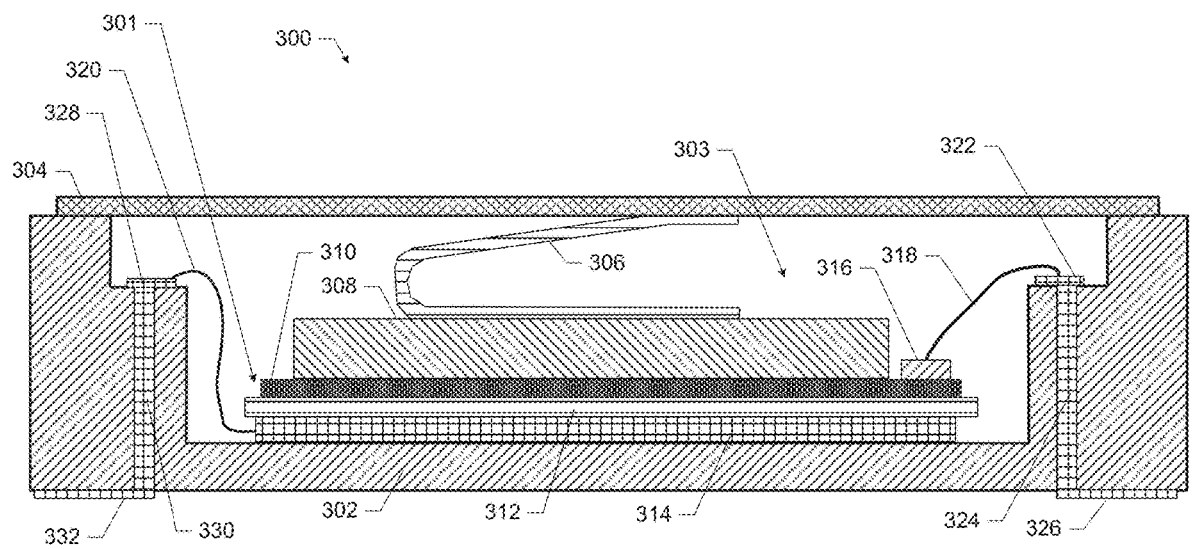
FIG. 3 illustrates a cross-section view of a circuit board mount battery implemented in a chip carrier according to some example embodiments.

Reference is now made to FIG. 3, which illustrates a cross-sectional view of an example embodiment of a circuit board mount battery 300. The circuit board mount battery 300 may be disposed within a chip carrier packaging, similar to the example embodiments described with respect to FIGS. 2A and 2B. The circuit board mount battery 300 may comprise a carrier 302 with an internal cavity 303 and a lid 304 affixed to the carrier 302 on a top side. A battery 301 may be disposed within the cavity 303 with wire bonds connecting the terminals of the battery 301 to internal leads.

In this regard, it can be seen that the carrier 302 comprises internal leads 322 and 328 disposed on the sidewalls of the cavity 303. The internal lead 322 may be electrically connected to the package via 324, which electrically connects the internal lead 322 to the external pin 326. Similarly, internal lead 328 may be electrically connected to the package via 330, which electrically connects the internal lead 328 to the external pin 332.

According to some example embodiments, the battery 301 disposed within the cavity 303 may formed in a number of different manners as described herein. For example, as shown in FIG. 3, the battery 301 may be constructed as a battery stack. According to some example embodiments, the battery stack may be affixed to the base of the cavity 303 by a conductive adhesive (e.g., a conductive epoxy). A conductive layer 314 operating, for example, as a cathode may be disposed in contact with the conductive adhesive. According to some example embodiments, the conductive layer 314 may include a foil layer (not shown) that is physically coupled to an electrode material of the conductive layer 314, such as, for example, graphite, cadmium, zinc, or the like, for operation as a cathode. Alternatively, according to some example embodiments, the conductive layer 314 may be configured to operate as an anode within a different battery architecture. The conductive layer 314 may take any shape, such as a square or rectangular shape. According to some example embodiments, the conductive layer 314 may be sized such that the separator 312 extends beyond the top surface of the conductive layer 314 (as shown in FIG. 3) and is therefore undersized relative the separator 312.

Additionally, the separator 312 may be disposed on top of the conductive layer 314 to isolate the conductive layer 314 from another conductive layer 310, which may operate, for example, as an anode (or a cathode based on the architecture of the battery 301). According to some example embodiments, the separator 312 may comprise paper or, for example, other absorbent or porous material. According to some example embodiments, the separator 312 may be formed from a glass fiber. The separator 312 may have, for example, a square or rectangular shape that extends beyond the edges of the conductive layer 314 and the conductive layer 310.

The conductive layer 310 may also include a foil layer (not shown) that is physically coupled to an electrode material of the conductive layer 310. As an anode, the conductive layer 310 may comprise, for example, iron, carbon steel, cast iron, or the like. Alternatively, according to some example embodiments, the conductive layer 310 may be configured to operate as a cathode within a different battery architecture. The conductive layer 310 may also take any shape, such as a square or rectangular shape. According to some example embodiments, the conductive layer 310 may be sized such that the separator 312 extends beyond the bottom surface of the conductive layer 310 (as shown in FIG. 3) and is therefore undersized relative the separator 312.

For stability and structural integrity, the battery 301 may be subjected to a mechanical force applied by the bias member 306, which is shown as a spring (e.g., a brass spring). In this regard, the lid 304 may be securely affixed to a top of the carrier 302 using, for example, an adhesive or other bonding. The bias member 306 may be embodied, for example, as a spring (e.g., a leaf spring) or other device that exhibits a responsive bias force when compressed, such as a foam or the like. According to some example embodiments, the bias member 306 may be disposed between the lid 304 and a spacer 308. The spacer 308 may be an insulating member (e.g., a rigid or elastic block) that is sized to have a thickness that causes the bias member 306 to be depressed or deflected such that a sufficient force is applied to stabilize the battery 301 within the cavity 303. The thickness of the spacer 308 may be based on an internal height of the cavity 303 from the base to the underside of the lid 208. According to some example embodiments, the spacer 308 may comprise silicone or a similar substance.

Further, according to some example embodiments, the spacer 308 may be shaped to support a number of different functionalities. First, as mentioned above, the thickness (or height) of the spacer 308 may be determined such that the deflection of the bias member 306 applies a threshold force between the lid 208 and the spacer 308. Additionally, the spacer 308 may have a broadest surface area that is slightly smaller than the top surface area of the conductive layer 310 (e.g., about 75 to 90% of the surface area of the conductive layer 310). The similar surface area may operate to distribute the force applied by the bias member 306, which may be focused in a small area on the spacer 308, more evenly across the top surface area of the conductive layer 310 so as not to damage the conductive layer 310 under the more focused force of the bias member 306.

However, the spacer 308 may, according to some example embodiments, not cover an entire top surface area of the conductive layer 310 to facilitate wire bond connectivity to the conductive layer 310. As such, as a balance between the distributed application of force from the bias member 306 and accessibility for wire bonding, the spacer 308 may have a diamond or circular shape that maintains corners or edges of the conductive layer 310 accessible from the top for wire bonding from the conductive layer 310 to one or more internal leads, such as internal lead 318.

Accordingly, the conductive layer 310 and conductive layer 314 may operate as the anode and cathode of the battery 301 and may therefore form terminals of the battery 301. For application of the circuit board mount battery 300, these terminals may be electrically connected, for example via wire bonds, to the internal leads of the carrier 302 so that the terminals are electrically accessible at the exterior of the packaging. Such wire bonds may be small electrically conductive wires that form internal connections between a component or die within the cavity 303 and the internal leads of the cavity 303. As such, according to some example embodiments, a first wire bond 318 may be electrically connected between the conductive layer 310 and the internal lead 322. According to some example embodiments, the first wire bond 318 may be directly connected to the conductive layer 310 or the first wire bond 318 may be connected to a connection shim 316 disposed on the conductive layer 310. The connection shim 316 may be conductive and affixed to the conductive layer 310 to facilitate ease of soldering and connection between the first wire bond 318 and the conductive layer 310. According to some example embodiments, the connection shim 316 may be gold or gold-plated to facilitate a high-quality electrical connection between the conductive layer 310 and the first wire bond 318.

Similarly, a second wire bond 320 may be electrically connected between the conductive layer 314 and the internal lead 328. According to some example embodiments, the second wire bond 320 may be directly connected to the conductive layer 314 or the second wire bond 320 may be connected to a connection shim disposed on the conductive layer 314, which may also be gold or gold-plated. Alternatively, because the conductive layer 314 may be affixed to the base of the cavity 303 via a conductive adhesive, the conductive adhesive may extend beyond conductive layer 314 on the base and the second wire bond 320 may be connected to the conductive adhesive to make an electrical connection to the conductive layer 314.

According to some example embodiments, the cavity 303 may otherwise be dry or may be filled with an electrolyte, such as a liquid electrolyte or a gel polymer electrolyte. According to some example embodiments, the separator 312 may be porous and therefor an electrolyte may be absorbed into the separator 312. Further, the electrolyte may be cured in position between the anode and the cathode of the battery 301 (e.g., between the conductive layer 310 and the conductive layer 314). According to some example embodiments, the electrolyte may otherwise encapsulate the battery 301.

In the construction of the circuit board mount battery 300, an example method or process of constructing the circuit board mount battery 300 may comprise cutting the conductive layer 314 (e.g., as a negative electrode or the cathode)

to a size that is undersized relative to the separator 312. The conductive layer 314, according to some example embodiments, may also be cut to include chamfered edges on two of the corners of the conductive layer 314. With the conductive layer 314 cut to size, a conductive adhesive, such as a conductive epoxy, may be applied to the base of the cavity 303 and the conductive layer 314 may be applied to the conductive adhesive. In this regard, according to some example embodiments, the conductive layer 314 may comprise a foil layer that is disposed on bottom side of the conductive layer 314 such that the foil layer comes into contact with the conductive adhesive. The conductive adhesive may then be cured (e.g., at 80 degrees Celsius for 8 hours) to bond the conductive layer 314 to the base of the cavity 303.

Subsequently, the second wire bond 320 may be installed between the base of the cavity 303, which in some example embodiments may be conductive, and the internal lead 320. According to some example embodiments, additional wire bond connections between the base and/or the conductive layer 314 may be formed with other internal leads within the cavity 303 for improved conduction and/or redundancy. According to some example embodiments, the separator 312 may be cut to a size larger than the conductive layer 314 (and the conductive layer 310), and the separator 312 may be applied or stacked onto the conductive layer 314. According to some example embodiments, the separator 312 may be secured or tacked with small spots of nonconductive adhesive (e.g., nonconductive epoxy) at locations on the conductive layer 314 (e.g., on two corners of the conductive layer 314).

The conductive layer 310 may then be cut, according to some example embodiments, to a size that is smaller than the separator 312 and applied to the separator 312. Again, a nonconductive adhesive may secure or tack the conductive layer 310 to the separator 312 at small spots on the conductive layer 310 (e.g., on two corners of the conductive layer 310). According to some example embodiments, a foil layer of the conductive layer 310 may be faced upwards such that the foil layer is not in contact with the separator 312. With the battery stack assembled, first wire bond 318 may be installed between the foil layer of the conductive layer 310 and the internal lead 322. According to some example embodiments, additional wire bond connections between the conductive layer 310 may be formed with other internal leads within the cavity 303 for improved conduction and/or redundancy.

The spacer 308 may then be cut, for example, into a diamond shape. The bias member 306 may be secured to the lid 304 via a nonconductive adhesive. Electrolyte liquid may then be dispensed into the cavity 303, and the spacer 308 may be applied to the top of the conductive layer 310. The lid 304, with the bias member 306, may then be positioned onto a top surface of the carrier 302 such that the bias member 306 contacts the spacer 308, and the lid 304 may be sealed to the carrier 302.

Figure 4:
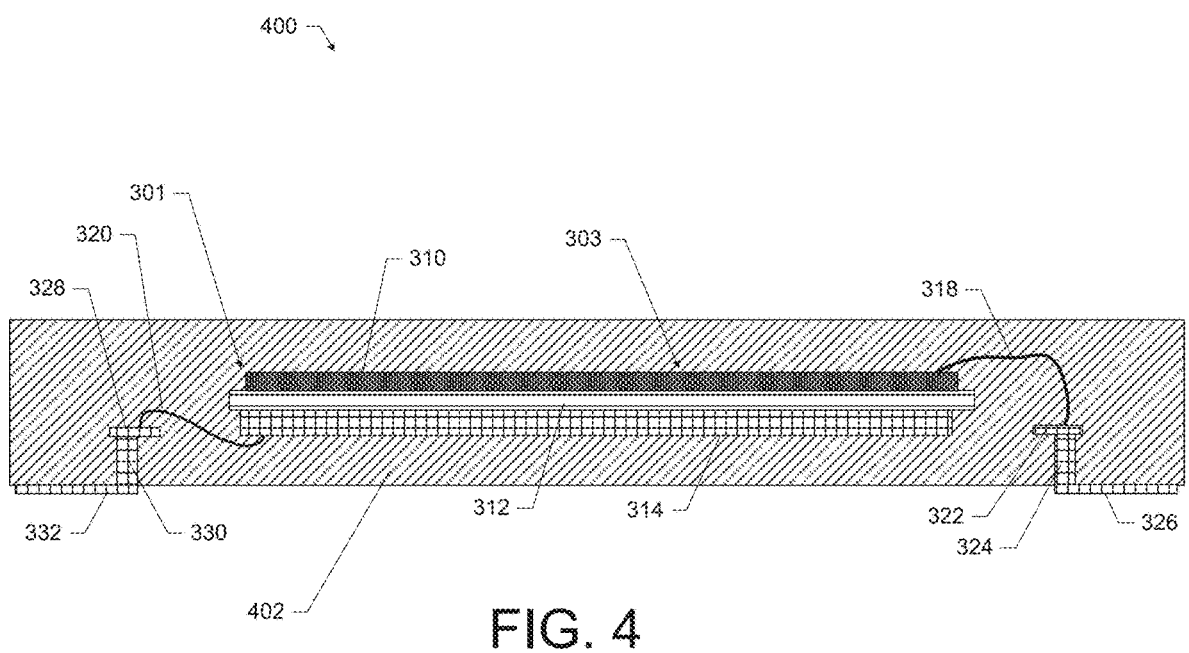
FIG. 4 illustrates a cross-section view of a circuit board mount battery implemented in a flat package according to some example embodiments.

Having described an example embodiment of a circuit board mount battery with an example battery stack in a chip carrier package, another example embodiment is shown in FIG. 4 where the package is formed as a sealed mold. In this regard, the circuit board mount battery 400 may be an implementation according to some example embodiments that is formed as a surface mount flat package. In this regard, the battery 301 may treated as a die that is encapsulated in, for example, an insulating material 402 (e.g., a resin) that is molded around the battery 301. As such, the cavity 303 of the circuit board mount battery 400 may be substantially filled by the battery 301 and, for example, a gel-based electrolyte.

In the circuit board mount battery 400, the battery 301 may, again, be constructed in a number of different ways as described herein with a battery stack being just one example. As such, the battery 301 as a battery stack may be structured the same as described above with first and second wire bonds 318 and 320 connected between the conductive layers 310 and 314, and the internal leads 328 and 322, respectively. As such, the construction of the circuit board mount battery 400 may be similar to the circuit board mount battery 300 with the exception that, rather than being constructed within the cavity 303, the battery 301 may be constructed and then subjected to encapsulation within a resin.

Figure 5:
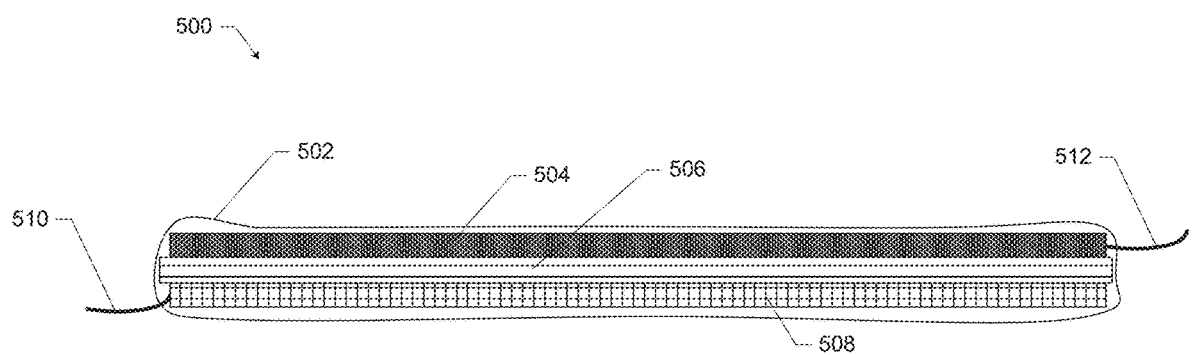
FIG. 5 illustrates a cross-section view of a battery for inclusion in a circuit board mount battery according to some example embodiments.

According to some example embodiments, the battery that may be applied within the context of the circuit board mount battery 300 or 400 may be constructed and disposed within a pouch. Additionally, the conductive layers of the internal battery may be constructed as pressed pellets as further described herein. As such, as shown in FIG. 5, the battery 500 may be constructed with a first conductive layer 508 that is separated by a separator 506 from a second conductive layer 504. According to some example embodiments, the conductive layer 504, the separator 506, and the conductive layer 508, may otherwise be the same or similar to the conductive layer 314, the separator 312, and the conductive layer 320, respectively, as described above. However, the conductive layers 504 and 508 may be constructed in a variety of ways.

According to some example embodiments, the conductive layers 504, 508 and the separator 506 may be disposed within a pouch 502. The pouch 502 may formed of a nonconductive flexible material that can be sealed around the conductive layers and separator. According to some example embodiments, the pouch 502 may have length and width dimensions of about 1 centimeter by 1 centimeter. Additionally, the pouch 502 may have an internal volume that permits an electrolyte to be included within the pouch 502. The pouch 502 may also permit wires 510 and 512 to extend out of the pouch 502 with the pouch 502 remaining sealed around the wires. Wires 510 and 512 may each be connected to a conductive layer that forms an anode or a cathode to thereby operate as external terminals for the battery 500. When implemented in the context of a circuit board mount battery, the wires 510 and 512 may be connected to internal leads within a package.

According to some example embodiments, the conductive layer 504 and 508 may be formed on respective metal foils. In this regard, according to some example embodiments, a slurry of material may be applied to the foils and dried to form the conductive layers 504 and 508. As such, at least one or both of the anode or the cathode may be formed in the manner as a coating disposed on a metal foil. The coating may be formed via a slurry comprising a binder and a conductive additive (e.g., lithium cobalt oxide ($LiCoO_2$), graphite, or the like) that is applied to the metal foil.

According to some example embodiments, the conductive layer 504 and 508 may be formed as pellets. In this regard, materials for the conductive layers may be pressed into the pellet form. The pellets may be, for example, formed with a thickness of about 1 millimeter. According to some example embodiments, one of the conductive layers may be formed as a lithium cobalt oxide ($LiCoO_2$) pellet. Additionally or alternatively, one of the conductive layers may be formed as a graphite pellet. Further, according to some example embodiments, the separator 506 that may be implemented between the pellets may be a glass fiber separator.

More specifically, the pellets may be constructed via a process that begins with mixing a dry powder of active material with a binder material, and possibly a carbon additive. This mixture may then be pressed into a pellet having a thickness of about 1 millimeter. According to some example embodiments, a lithium cobalt oxide pellet (e.g., the conductive layer 504) may be stacked on a glass fiber separator (e.g., the separator 506), and the glass fiber separator may be stacked on a graphite pellet (e.g., the conductive layer 508) to form a battery structure. Metal foils may then be applied to the top and bottom of the stacked battery structure. The metal foils may be, for example, copper or aluminum foils that may operate as current collectors. Accordingly, for example, the anode may be disposed on a first metal foil and the cathode may be disposed on a second metal foil. The resulting structure may then be inserted into a pouch (e.g., pouch 502), and an electrolyte may be dispensed into the pouch.

According to some example embodiments, rather than a battery stack, the battery that may be applied within the context of the circuit board mount battery 300 or 400 may be constructed in a rolled or coiled configuration. According to some example embodiments, as a coiled implementation, the battery 500 may be embodied as a dry stack structure. In this regard, according to some example embodiments, a battery 500 may be constructed in a stacked manner, and then rolled into a coiled configuration. As such, the conductive layers may be may be flexible to permit rolling into a coil structure. Accordingly, with the conductive layers 504 and 508, the separator 506, and the pouch 502 being flexible, the battery 500 may be rolled into a coiled shape. Once construction of the coiled battery 500 is complete, the battery 500 may be applied in the context of, for example, a chip carrier similar to circuit board mount battery 300, a flat package similar to circuit board mount battery 400, or in another board mount packaging configuration.

Figure 6:
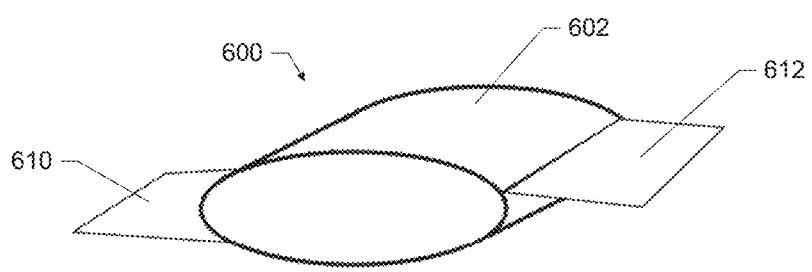
FIG. 6 illustrates a coiled battery for inclusion in a circuit board mount battery according to some example embodiments.

As such, similar to the battery stack, the coiled battery may be first constructed with a first conductive layer 508 that is separated by a separator 506 from a second conductive layer 504. According to some example embodiments, the conductive layer 504, the separator 506, and the conductive layer 508 may flexible to permit rolling into a coil, but may otherwise be the same or similar to the conductive layer 314, the separator 312, and the conductive layer 320, respectively, as described above. However, according to some example embodiments, the battery 500 may be constructed with a size that the battery 500 may be rolled into a coil in order to be disposed within a chip-scale package as described herein. As such, once constructed as shown in FIG. 5, the battery 500 may be rolled into a coil as shown in FIG. 6.

The coiled battery 600 may be spiral rolled into a cylinder-type shape for application within a package as described herein. Rather than wires, according to some example embodiments, the external terminals of the battery 600 may take the form of conductive sheets 610 and 612. Accordingly, the conductive sheets 610 may extend from the pouch 602 to facilitate electrical connectivity to the battery 600. For example, the conductive sheet 610 may be electrically connected to the cathode of the battery 600 and the conductive sheet 612 may be electrically connected to the anode of the battery 600.

Figure 7:
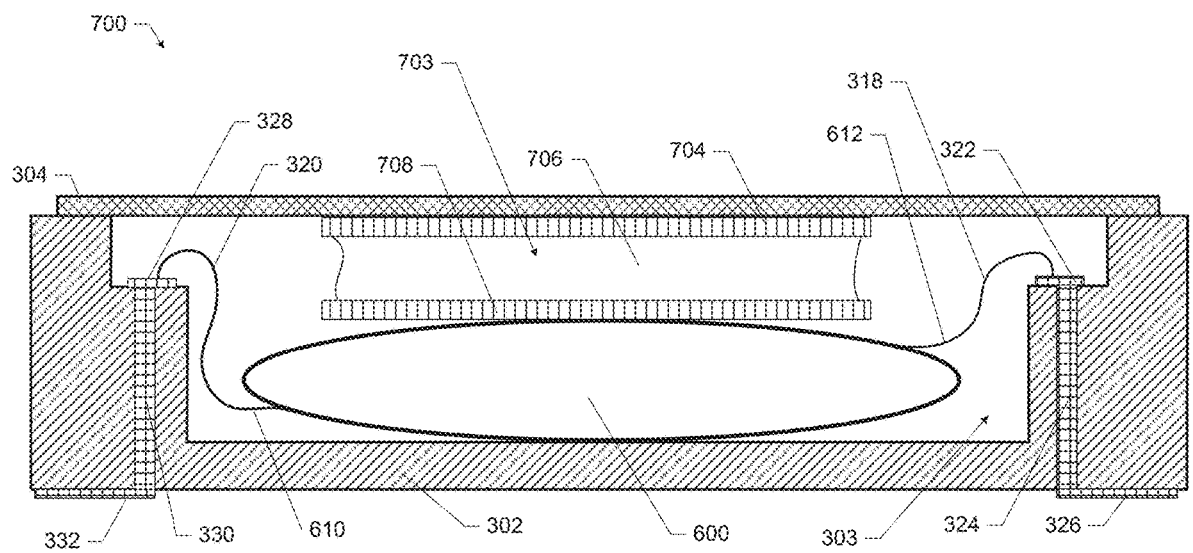
FIG. 7 illustrates a cross-section view of another circuit board mount battery implemented in a chip carrier according to some example embodiments.

As shown in FIG. 7, an example circuit board mount battery 700 is provided that illustrates the coiled battery 600 implemented within the chip carrier of FIG. 3 comprising the carrier 302 and the lid 304. The battery 600 may be disposed within the cavity 303 as shown with, for example, the conductive sheet 612 being connected to the first wire bond 318 and the conductive sheet 610 being connected to the second wire bond 320.

As an alternative to the leaf spring bias member 306 of FIG. 3, the bias member 703 of FIG. 7 may be embodied as a compression element. In this regard, the bias member 703 may comprise an upper rigid plate 704, a compression material 706, and a lower rigid plate 708. The upper rigid plate 704 and lower rigid plate 708 may be formed, for example, of a rigid material that maintains its shape under the application of a mechanical force. For example, the upper rigid plate 704 and the lower rigid plate 708 may be formed of a nonconductive material such as a plastic, ceramic, or the like. The upper rigid plate 704 and the lower rigid plate 708 may be cut into a cross or x-shape. The compression material 706 may be disposed between the upper rigid plate 704 and the lower rigid plate 708, and the compression material 706 may provide the bias member 703 with an elastic property. In this regard, the compression material 706 may provide an opposing force when placed under compression. According to some example embodiments, the compression material 706 may be formed of a silicone or other elastic material. The upper rigid plate 704 and the lower rigid plate 708 may operate as force distributing members that cause the compression opposing force to be distributed across the surface area of the upper rigid plate 704 and the lower rigid plate 708. Similar to the bias member 306 and the spacer 308, the bias member 703 may be disposed between the battery 600 and the lid 304. The bias member 703 may be sized such that when the lid 304 is sealed on the carrier 302, the bias member 703 is compressed to apply a force on the battery 600 to maintain the battery 600 in stable position within the cavity 303. The shape of the bias member 703 may provide access to the battery 600 (or another battery described herein) for connection to the terminals of the battery.

Figure 8:
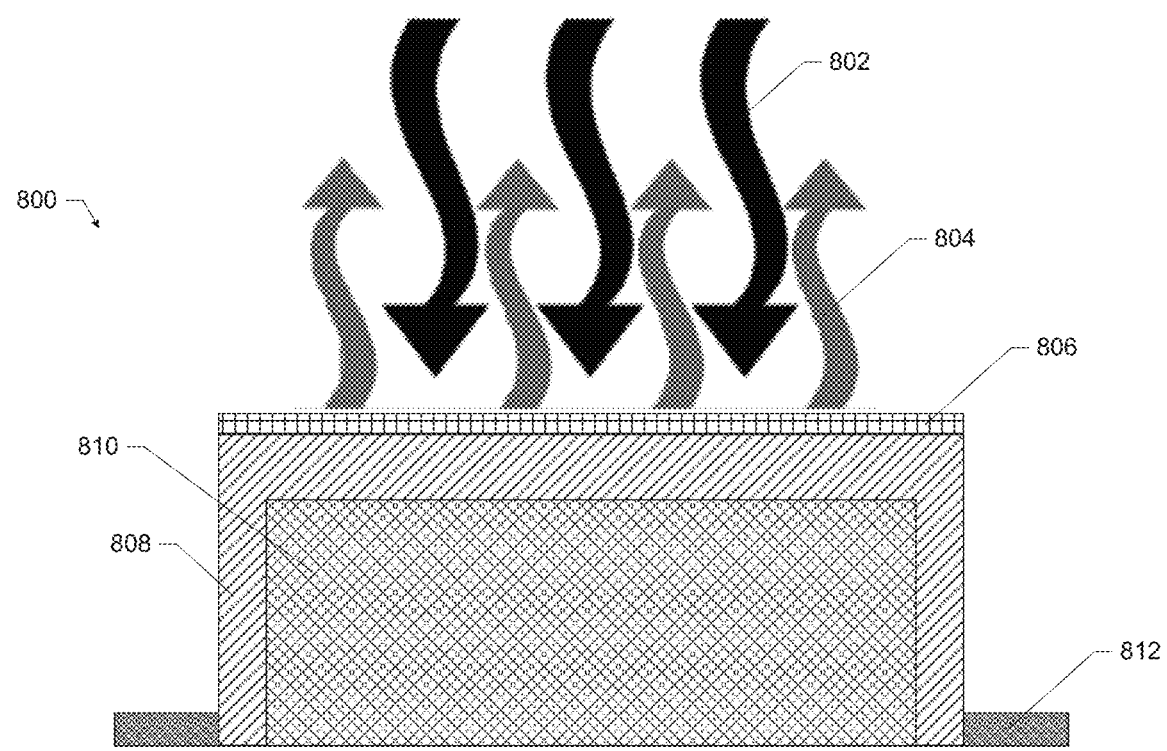
FIG. 8 illustrates a cross-section view of another circuit board mount battery with heat limiting features according to some example embodiments.

Now referring to FIG. 8, a circuit board mount battery 800 interacting with a reflow oven is shown. In this regard, one of the many challenges of implementing a circuit board mount battery is that high temperature environments, such as those involved in soldering components to circuit boards, may damage the battery. As such, according to some example embodiments, temperature controlling features may be implemented to limit exposure of the battery within the packaging to high temperatures of soldering techniques.

To do so, according to some example embodiments, a surface (e.g., a top surface) of the packaging 808 of the circuit board mount battery 800 may comprise an emissivity layer 806. The emissivity layer 806 may have a relatively low emissivity and may be applied as a coating onto a surface (e.g., a top surface) of the packaging 808 of the circuit board mount battery 800 (sometimes referred to as an e-coating) or as an affixed component. For example, the emissivity may be a fluid or powder that includes metals (e.g., an aluminum paste, indium tin oxide material) that can be applied to a surface of the packaging 808. Alternatively, a cleaned and polished foil, such as a metal foil (e.g., aluminum foil) may be applied to the surface of the packaging 808 and the emissivity layer 806. The emissivity layer 806 may operate to limit the penetration of heat 802 (e.g., certain wavelengths of energy) into the cavity of the packaging 808 from, for example, the oven to the battery 810, and, in some example embodiments, cause reflected heat 804 to be emitted. With respect to coatings, in some instances, the coating may be infused into the material of the packaging 808 at the time of manufacturing the packaging 808. Alternatively, the emissivity layer 806 may be applied through sputtering or magnetron sputtering vapor deposition (MSVD). Regardless of manner in which the emissivity layer 808 is formed or applied, the heat 802 from the oven that reaches the temperature sensitive materials of the battery 810 may be limited.

Additionally, according to some example embodiments, a phase change fill material that also operates to limit the penetration of heat to the battery 810 may be included, for example, in the cavity internal to the packaging 808. According to some example embodiments, the phase change material may be disposed within the cavity with the battery 810. In some example embodiments, the phase change fill material may surround or encapsulate the battery 810. Alternatively, the phase change fill material may be infused into the walls of the packaging 808. Regardless of the manner of application, the phase change fill material may buffer the direct conduction of thermal energy to limit peak temperatures that may be reached during, for example, a reflow cycle. Additionally or alternatively, the materials of the battery 810 (e.g., the conductive layers or the electrolyte) may include phase change fill materials for limiting the effect of heat on the battery 810. Such phase change fill material may be operate by changing states of matter (e.g., solid to liquid, solid to solid via changes in a crystalline structure, or the like) to absorb heat and limit peak temperatures. The phase change fill material may comprise hydrocarbons, paraffins, lipids, sugar alcohols, salt hydrates, or the like.

Additionally, the external pins 812, which may be tinned, may also provide a path for heat to reach the battery 810. However, implementation of heat reducing features such as implementation of the emissivity layer 806 and the phase change materials may permit the circuit board mount battery 800 to be soldered using typical circuit board assembly techniques, without damaging the battery 810. As such, the external pins 812 may be exposed to the full conductive and radiative thermal effects of a solder reflow process without damaging to the battery 810.

Figure 9:
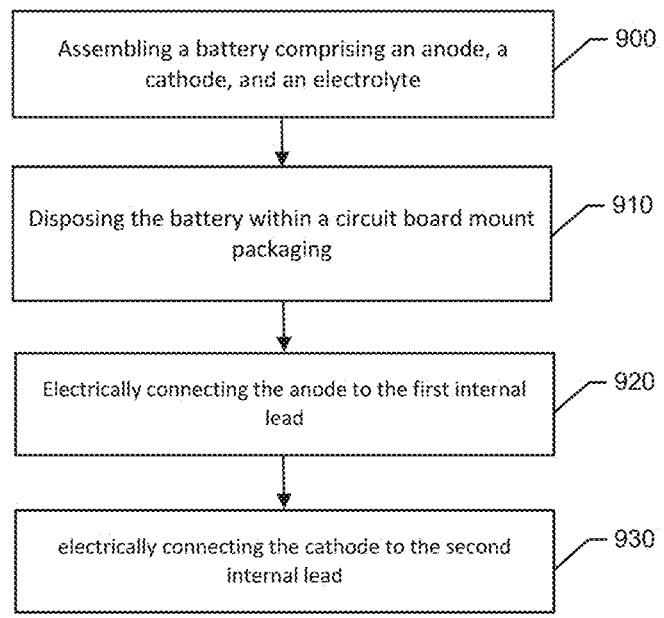
FIG. 9 illustrates a flow chart of an example method for assembling a circuit board mount battery according to some example embodiments.

Now referring to FIG. 9, an example method for constructing a circuit board mountable battery is provided. The example method may comprise, at 900, assembling a battery comprising an anode, a cathode, and an electrolyte. At 910, the example method may comprise disposing the battery within a circuit board mount packaging. In this regard, the circuit board mount packaging may comprise a plurality of external pins, a first internal lead, and a second internal lead. The first internal lead may be connected to a first external pin of the plurality of external pins and the second internal lead may be connected to a second external pin of the plurality of external pins. The plurality of external pins may be configured to be soldered to a circuit board. Further, the example method may comprise, at 920, electrically connecting the anode to the first internal lead, and, at 930, electrically connecting the cathode to the second internal lead.

According to some example embodiments, the anode comprises an anode layer and the cathode comprises a cathode layer. Additionally, assembling the battery may comprise curing a gel polymer electrolyte between the anode layer and the cathode layer prior to disposing the battery within a circuit board mount packaging. Alternatively, assembling the battery may comprise curing the gel polymer electrolyte between the anode layer and the cathode layer after disposing the battery within a circuit board mount packaging. Additionally or alternatively, according to some example embodiments, assembling the battery may comprise coating a metal foil with a slurry comprising a binder and a conductive additive to form a coated electrode as the anode or the cathode. Alternatively, assembling the battery may comprise pressing the binder and the conductive additive to form a pellet electrode as the anode or the cathode.

Additionally, according to some example embodiments, an apparatus for mounting on a circuit board is provided. The apparatus may comprise a circuit board mount packing and a battery. The circuit board mount packaging may comprise a cavity, a first internal lead, and a second internal lead. The first internal lead may be connected to a first external pin and the second internal lead may be connected to a second external pin. The battery may be disposed within the cavity of the circuit board mount packaging. The battery may comprise an anode and a cathode as conductive layers. The anode may be wire bond connected to the first internal lead and the cathode may be wire bond connected to the second internal lead.

Additionally, according to some example embodiments, the circuit board mount packaging may comprise a chip carrier. The circuit board mount packaging may further comprise a lid configured to cover the cavity, a spacer that physically contacts the battery, and a spring disposed between the lid and the spacer. Additionally, according to some example embodiments, the spring may comprise brass or the spacer may comprise silicone. Additionally or alternatively, the anode may be disposed on a first metal foil and the cathode may be disposed on a second metal foil. Additionally or alternatively, at least one of the anode or the cathode may be formed via a coating disposed on a metal foil. The coating may be formed via a slurry comprising a binder and a conductive additive that is applied to the metal foil. Alternatively, at least one of the anode or the cathode is formed as a pressed pellet.

Additionally or alternatively, the battery may further comprise a connection shim connected to either the anode or the cathode. The anode may be wire bond connected to the first internal lead through the connection shim or the cathode may be wire bond connected to the second internal lead through the connection shim. Additionally or alternatively, the battery may be constructed as a battery stack. The anode may comprise an anode layer of the battery stack and the cathode may comprise a cathode layer of the battery stack. Additionally or alternatively, the battery may comprise a gel polymer electrolyte that has been cured between the anode layer and the cathode layer. Additionally or alternatively, a separator may be disposed between the anode and the cathode, and the anode, the cathode, and the separator are coiled.

Additionally or alternatively, the battery may be disposed with a pouch. Additionally or alternatively, the circuit board mount packaging may be through-hole packaging or surface mount packaging. Additionally or alternatively, the apparatus may comprise a phase change fill material disposed within the cavity to absorb heat and limit peak temperatures within the cavity. Additionally or alternatively, a surface of the circuit board mount packaging may comprise an emissivity layer configured to limit the penetration of heat into the cavity.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Moreover, although the foregoing descriptions and the associated drawings describe exemplary embodiments in the context of certain exemplary combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. In cases where advantages, benefits or solutions to problems are described herein, it should be appreciated that such advantages, benefits and/or solutions may be applicable to some example embodiments, but not necessarily all example embodiments. Thus, any advantages, benefits or solutions described herein should not be thought of as being critical, required or essential to all embodiments or to that which is claimed herein. Although specific terms are employed herein, they are used in a generic and descriptive sense only and not for purposes of limitation.

That which is claimed:

1. An apparatus for mounting on a circuit board, the apparatus comprising: a circuit board mount packaging comprising a cavity, a first internal lead, and a second internal lead, the first internal lead connected to a first external pin and the second internal lead connected to a second external pin; and a battery disposed within the cavity of the circuit board mount packaging, the battery comprising an anode and a cathode, the anode being wire bond connected to the first internal lead and the cathode being wire bond connected to the second internal lead, wherein at least one of the anode or the cathode is formed as a coating disposed on a metal foil, the coating being formed via a slurry comprising a binder and a conductive additive that is applied to the metal foil.

2. The apparatus of claim 1, wherein the circuit board mount packaging comprises a chip carrier; and
wherein the circuit board mount packaging further comprises:
a lid configured to cover the cavity;
a spacer that physically contacts the battery; and
a spring disposed between the lid and the spacer.

3. The apparatus of claim 1, wherein at least one of the anode or the cathode is formed as a pressed pellet.

4. The apparatus of claim 1, wherein the battery further comprises a connection shim connected to either the anode or the cathode; and
wherein the anode is wire bond connected to the first internal lead through the connection shim or the cathode is wire bond connected to the second internal lead through the connection shim.

5. The apparatus of claim 1, wherein the battery is constructed as a battery stack, wherein the anode comprises an anode layer of the battery stack and the cathode comprises a cathode layer of the battery stack.

6. The apparatus of claim 5, wherein the battery comprises a gel polymer electrolyte that has been cured between the anode layer and the cathode layer.

7. The apparatus of claim 1, wherein a separator is disposed between the anode and the cathode, and wherein the anode, the cathode, and the separator are coiled.

8. The apparatus of claim 7, wherein the battery is disposed with a pouch.

9. The apparatus of claim 1, wherein a surface of the circuit board mount packaging comprises an emissivity layer configured to limit penetration of heat into the cavity.

10. The apparatus of claim 1, further comprising a phase change fill material disposed within the cavity to absorb heat and limit peak temperatures within the cavity.

11. The apparatus of claim 1, wherein the circuit board mount packaging is through-hole packaging or surface mount packaging.

12. An apparatus for mounting on a circuit board, the apparatus comprising: a circuit board mount packaging comprising a plurality of external pins, a first internal lead, and a second internal lead; the first internal lead connected to a first external pin of the plurality of external pins and the second internal lead connected to a second external pin of the plurality of external pins; the plurality of external pins being configured to be soldered to a circuit board; and a battery disposed within the circuit board mount packaging; wherein the battery comprises: an anode electrically connected to the first internal lead; a cathode connected to the second internal lead; a separator disposed between the anode and the cathode; and an electrolyte, wherein at least one of the anode or the cathode is formed as a coating disposed on a metal foil, the coating being formed via a slurry comprising a binder and a conductive additive that is applied to the metal foil.

13. The apparatus of claim 12, wherein at least one of the anode or the cathode is formed as a pressed pellet electrode comprising a binder and a conductive additive.

14. The apparatus of claim 12, wherein the battery is constructed as a battery stack, wherein the anode comprises an anode layer of the battery stack and the cathode comprises a cathode layer of the battery stack.

15. The apparatus of claim 12, wherein the anode, the cathode, and the separator are coiled.

16. A method for constructing a circuit board mount battery, the method comprising: assembling a battery comprising an anode, a cathode, and an electrolyte; disposing the battery within a circuit board mount packaging, the circuit board mount packaging comprising a plurality of external pins, a first internal lead, and a second internal lead, the first internal lead being connected to a first external pin of the plurality of external pins and the second internal lead being connected to a second external pin of the plurality of external pins, the plurality of external pins being configured to be soldered to a circuit board; electrically connecting the anode to the first internal lead; and electrically connecting the cathode to the second internal lead, wherein the anode comprises an anode layer and the cathode comprises a cathode layer; wherein assembling the battery comprises: curing a gel polymer electrolyte between the anode layer and the cathode layer prior to disposing the battery within the circuit board mount packaging; or curing the gel polymer electrolyte between the anode layer and the cathode layer after disposing the battery within the circuit board mount packaging.

17. The method of claim 16, wherein assembling the battery comprises:
coating a metal foil with a slurry comprising a binder and a conductive additive to form the anode or the cathode; or
pressing the binder and the conductive additive to form a pellet electrode as the anode or the cathode.

* * * * *